(12) United States Patent
Mirabedini et al.

(10) Patent No.: US 6,930,362 B1
(45) Date of Patent: Aug. 16, 2005

(54) CALCIUM DOPED POLYSILICON GATE ELECTRODES

(75) Inventors: Mohammad R. Mirabedini, Redwood City, CA (US); Grace S. Sun, Sunnyvale, CA (US); Sheldon Aronowitz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/698,167

(22) Filed: Oct. 30, 2003
(Under 37 CFR 1.47)

(51) Int. Cl.$^7$ ............ H01L 29/76; H01L 21/336
(52) U.S. Cl. ............ 257/412; 257/607; 438/197; 438/585
(58) Field of Search ............ 257/412, 413, 257/607, 369; 438/197, 532, 585, 592

(56) References Cited

U.S. PATENT DOCUMENTS

| | | | |
|---|---|---|---|
| 4,755,865 A | * | 7/1988 | Wilson et al. ............ 257/754 |
| 5,937,303 A | * | 8/1999 | Gardner et al. ............ 438/305 |
| 6,373,113 B1 | * | 4/2002 | Gardner et al. ............ 257/411 |
| 2003/0168705 A1 | * | 9/2003 | Tanida et al. ............ 257/410 |
| 2004/0089887 A1 | * | 5/2004 | Aronowitz et al. ......... 257/288 |
| 2004/0110328 A1 | * | 6/2004 | Aronowitz et al. ......... 438/162 |
| 2004/0121550 A1 | * | 6/2004 | Zubkov et al. ............ 438/287 |

* cited by examiner

*Primary Examiner*—Mark V. Prenty
(74) *Attorney, Agent, or Firm*—Beyer Weaver & Thomas, LLP

(57) ABSTRACT

A calcium doped polysilicon gate electrodes for PMOS containing semiconductor devices. The calcium doped PMOS gate electrodes reduce migration of the boron dopant out of the gate electrode, through the gate dielectric and into the substrate thereby reducing the boron penetration problem increasingly encountered with smaller device size regimes and their thinner gate dielectrics. Calcium doping of the gate electrode may be achieved by a variety of techniques. It is further believed that the calcium doping may improve the boron dopant activation in the gate electrode, thereby further improving performance.

25 Claims, 3 Drawing Sheets

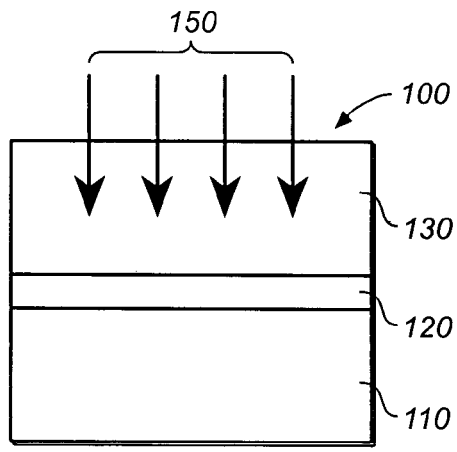
FIG._1
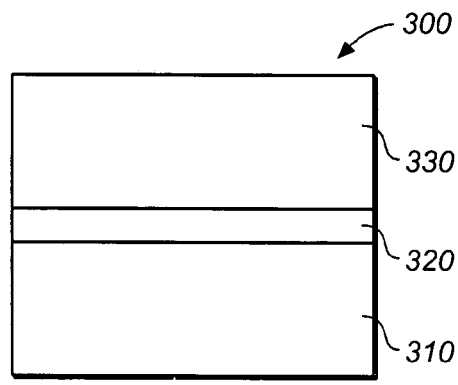
FIG._3
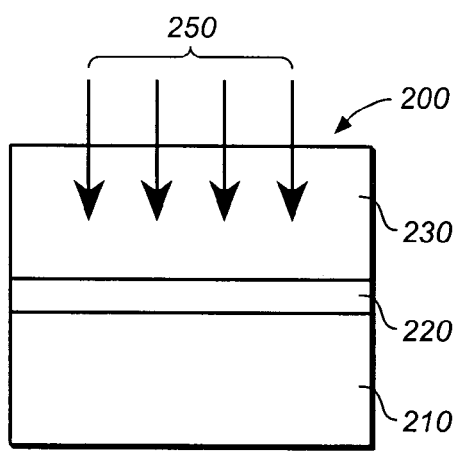
FIG._2A
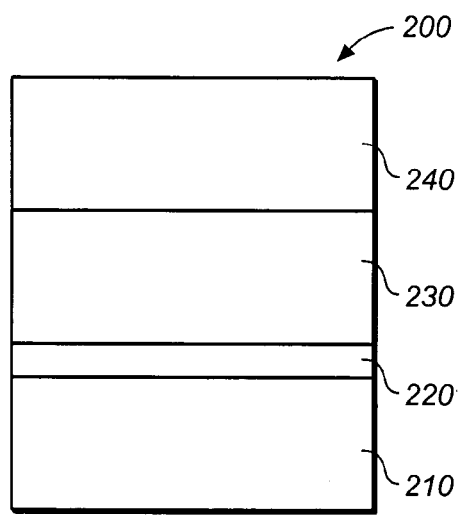
FIG._2B
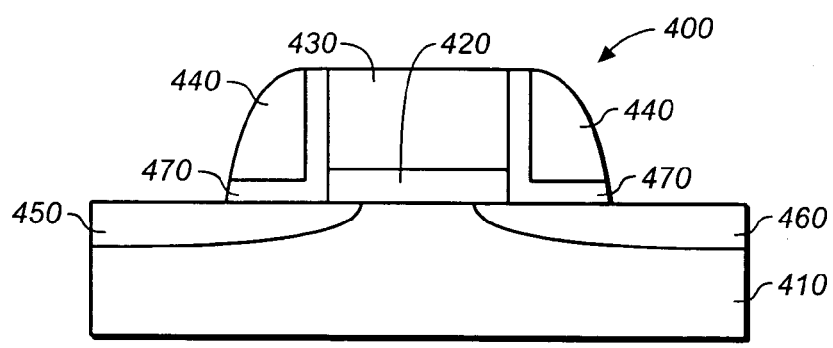
FIG._4

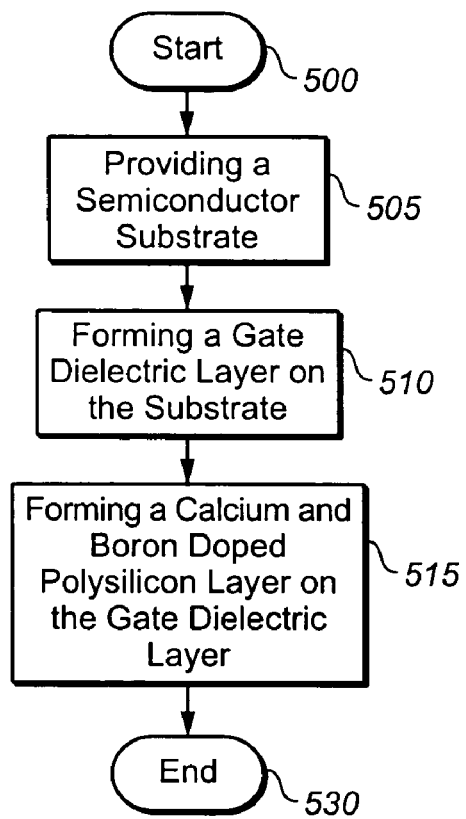
FIG._5
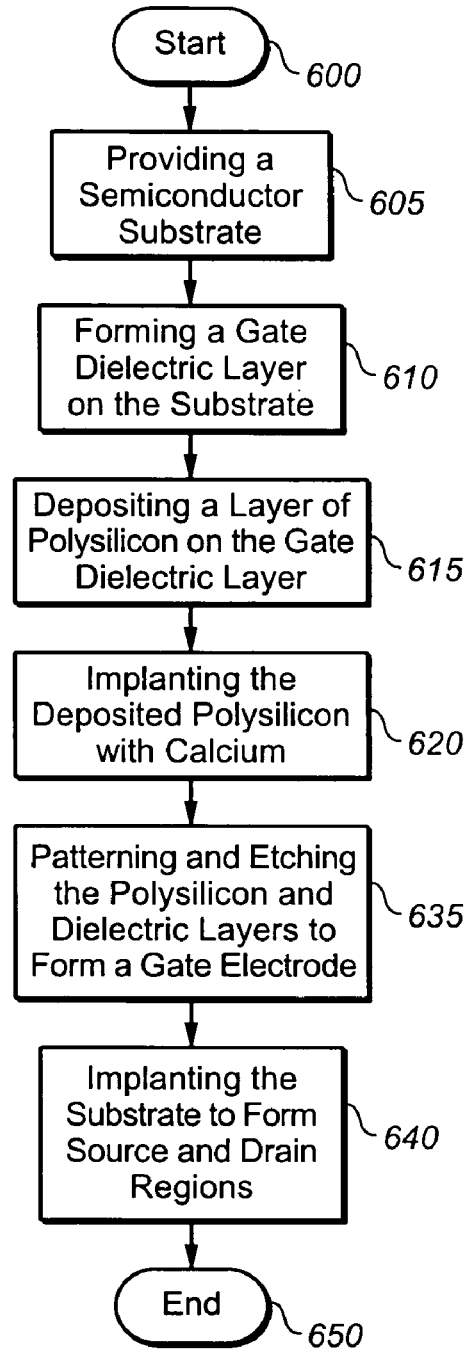
FIG. 6

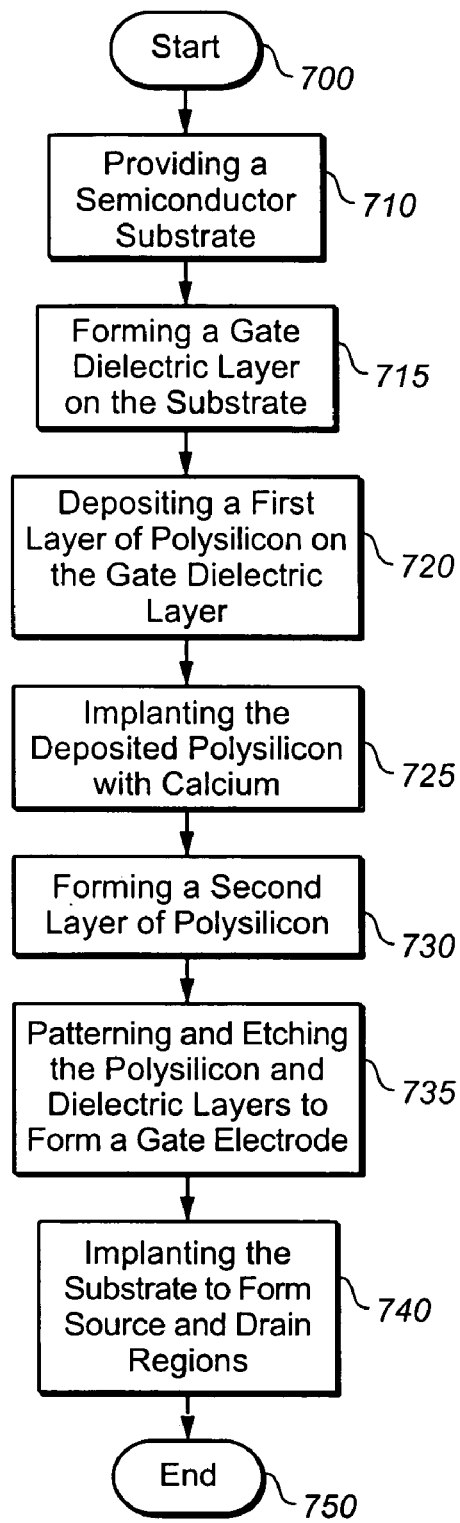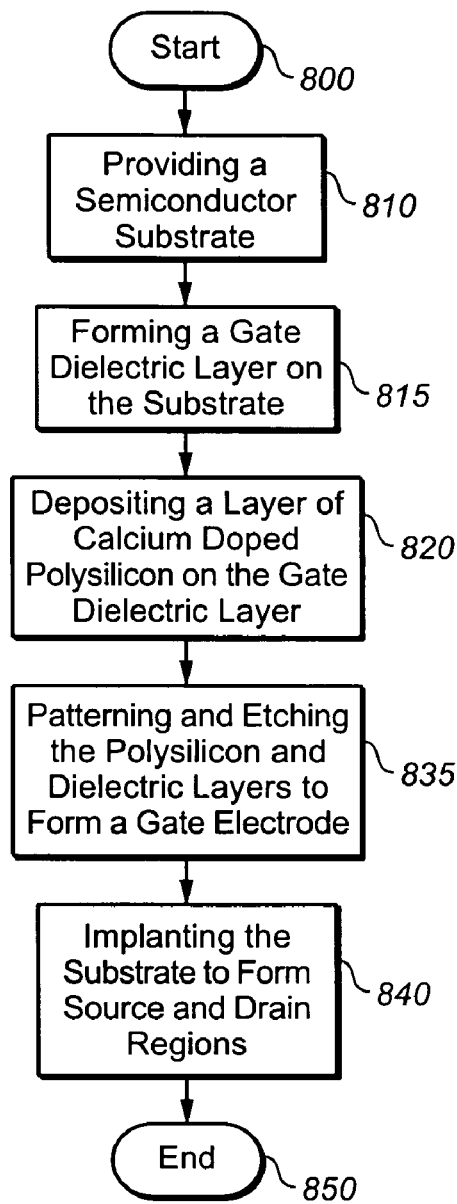
FIG._7
FIG._8

US 6,930,362 B1

CALCIUM DOPED POLYSILICON GATE ELECTRODES

FIELD OF THE INVENTION

The present invention relates generally to P-channel MOS field effect transistors (MOSFETs), and more particularly, to preventing boron penetration from the gate electrode in a MOSFET and with the effect of preventing poly depletion in the gate electrode.

BACKGROUND OF THE INVENTION

As CMOS manufacturing technology achieves smaller feature sizes, for example, 01. microns and below, there has been a corresponding scaling down of the gate dielectric. The scaled-down gate dielectric has become so thin that boron, which is traditionally used to dope the gate electrode for P-channel MOS field effect transistors, can migrate from the gate electrode through the thin gate dielectric and penetrate into the underlying semiconductor substrate, causing unwanted changes in the properties of the substrate.

Boron penetration may be reduced by incorporating nitrogen in the gate dielectric or polysilicon gate. However, that reduction is not usually sufficient for very thin gate oxides, and in addition it may even exacerbate the poly depletion effect.

The use of metal gate electrodes or fully silicided gate electrodes may reduce both the boron penetration and the poly depletion effect. However, these approaches have substantial drawbacks in that determining the right work function for such gate electrodes that is suitable for either of N or P channel devices (necessary for CMOS devices) is difficult. In addition, the interface of these materials with common gate dielectric materials, such as $SiO_2$, is not nearly so well understood as the silicon (including polysilicon) and gate oxide interface, so the stability of these materials on a gate dielectric is an issue.

Accordingly, it is desirable to find a way to improve semiconductor device performance by reducing boron penetration while improving the poly depletion effect by achieving a better dopant activation in gate electrode, or at least without any deterioration of poly depletion effect in scaled down MOSFET devices.

SUMMARY OF THE INVENTION

The present invention provides calcium doped polysilicon gate electrodes for PMOS containing semiconductor devices. The calcium doped PMOS gate electrodes reduce migration of the boron dopant out of the gate electrode, through the gate dielectric and into the substrate thereby reducing boron penetration problem increasingly encountered with smaller device size regimes and their thinner gate dielectrics. Calcium doping of the gate electrode may be achieved by a variety of techniques. It is further believed that the calcium doping may improve the boron dopant activation in the gate electrode, thereby further improving performance by reducing the poly depletion effect.

In one aspect, the invention pertains to a semiconductor device. The device includes a P-channel MOS field-effect transistor having a semiconductor substrate, a gate dielectric on the substrate, and a calcium and boron doped polysilicon gate electrode on the gate dielectric.

In another aspect, the invention pertains to a method of making a semiconductor device having a P-channel MOS field-effect transistor. The method involves providing a semiconductor substrate, forming a gate dielectric layer on the substrate, and forming a calcium and boron doped polysilicon gate electrode layer on the gate dielectric.

In various embodiments of the present invention, calcium doping of the gate electrode layer may precede or follow boron doping, and the calcium may be distributed throughout the gate poly or concentrated at or near the gate electrode/gate dielectric interface.

These and other aspects and advantages of the present invention are described below where reference to the drawings is made.

BRIEF DESCRIPTION OF THE DRAWINGS

The invention, together with further advantages thereof, may best be understood by reference to the following description taken in conjunction with the accompanying drawings in which:

FIG. 1 illustrates a process of the calcium doping of a polysilicon layer that has been applied over a gate dielectric layer for the purpose of creating a P-channel MOS field-effect transistor according to an embodiment of the present invention.

FIGS. 2A and 2B illustrate a method of calcium doping a polysilicon layer over a gate dielectric layer according to an alternate embodiment of the present invention, wherein a first layer of polysilicon is doped with calcium followed by the application of a second layer of polysilicon.

FIG. 3 illustrates a method of calcium doping a polysilicon layer over a gate dielectric layer according to an further embodiment of the present invention, wherein a layer of calcium doped polysilicon is deposited on the gate dielectric layer.

FIG. 4 illustrates a completed P-channel MOS field effect transistor, with a calcium- and boron-containing polysilicon gate electrode according to an embodiment of the present invention.

FIG. 5 illustrates a general process flow of stages in a method of providing a calcium doped poly gate electrode layer in a partially formed semiconductor device in accordance with the present invention.

FIGS. 6, 7, and 8 illustrate process steps suitable for fabricating a calcium doped gate electrode in a P-channel MOS field effect transistor in accordance with different specific embodiments of the present invention.

DETAILED DESCRIPTION OF THE INVENTION

While the present invention will be described with reference to a few specific embodiments, the description is illustrative of the invention and not to be construed as limiting the invention. Various modifications to the present invention can be made to the preferred embodiments by those skilled in the art without departing from the true spirit and scope of the invention as defined by the appended claims. The present invention relates to a semiconductor device and several methods for creating that semiconductor device. In the described embodiments of the invention, a gate electrode for a P-channel MOSFET, wherein calcium has been added to a polysilicon layer that has been applied over a gate dielectric layer during device fabrication. This calcium may be incorporated into the polysilicon in a variety of ways including implantation to dope a deposited polysilicon gate electrode material, deposition of a calcium doped polysilicon gate electrode material, for example, by chemical vapor deposition (CVD) or by some other method known to persons skilled in the art, or some combination of implantation and deposition.

A schematic of a partially formed semiconductor device 100 incorporating a p-channel MOSFET is shown in FIG. 1. The device may be, for example a CMOS device or a stand-alone PMOS device. The partially formed device 100 includes a gate dielectric layer 120 formed over a semiconductor substrate 110. The substrate 110 will typically be silicon and the dielectric 120 will typically be silicon dioxide ($SiO_2$), although those skilled in the art will understand that other materials are also possible. A layer of polysilicon 130 is formed over the dielectric layer, generally by a deposition process, such as CVD. For the PMOS gate, the deposited polysilicon layer 130 may be doped with boron, or boron may be incorporated into deposited polysilicon layer 130 by some other means, such as implantation, following deposition or in subsequent steps.

As noted above, the present invention involves the incorporation of calcium into the gate electrode material. The calcium reduces boron migration from the gate electrode poly and so reduces boron penetration. In one embodiment of the present invention, the polysilicon is deposited to the full thickness desired for the PMOS gate electrode. Then, a calcium implant 150 is performed in order to incorporate calcium into the polysilicon layer 130. In one embodiment, the calcium is concentrated in the polysilicon near the interface with the gate dielectric layer 120 on which the poly layer 130 is formed in order to locate the calcium where the boron migration from the poly giving rise to the boron penetration. To do so, a high-energy calcium implant 150 is performed on the full thickness poly in order to incorporate calcium into polysilicon layer 130 adjacent to the gate dielectric interface. For example, in a 0.1 micron device size regime, the gate dielectric thickness may be about 16 Å and the polysilicon gate electrode thickness may be about 1000–1500 Å. For a deep implant into polysilicon of that thickness, an implant power of about 2–4 keV may be used.

Of course, as device size is scaled down further, the various layer thicknesses and corresponding implant power requirements will be scale accordingly. In addition, while the invention is expected to be particularly useful in device size regimes of 0.1 micron and below, it is not limited to application in these device size regimes, but may also be usefully applied to larger device size regimes, including 0.13, 0.15 and 0.18 micron and larger.

The dose of the calcium implant should be sufficient to achieve a calcium concentration high enough to interact with boron in the region of the calcium implant of the final gate electrode. A suitable dose will generally be in the range of about $0.5e15/cm^2$ to $2e15/cm^2$, for example $1e15/cm^2$. Given the parameters provided herein, one skilled in the art would be able to readily determine the implant conditions needed to achieve the desired calcium implant.

An alternate embodiment of the present invention is shown schematically in FIGS. 2A and 2B. In this embodiment a partially formed semiconductor device 200 is shown in which a first thin layer of polysilicon 230 is applied over a gate dielectric 220 and a semiconductor substrate 210. In a 0.1 micron device size regime, the thin poly layer 230 may be about 100 to 200 Å thick, for example. As shown in FIG. 2A, following deposition of the thin polysilicon layer 230, a low energy (e.g., about 1–2 KeV, for example about 1 KeV) calcium implant into the thin poly layer 230 is conducted. After the implant 250 has been performed, a second generally thicker layer of polysilicon 240 is applied to make the full desired thickness for the gate electrode, as shown in FIG. 2B. This technique may be preferred in instances where there is concern about the control of the deep implant prescribed in the prior embodiment.

It should also be understood that the deposited poly in either of the foregoing embodiments or layers may or may not contain boron. That is, for example, undoped polysilicon may be deposited on the gate dielectric layer and then subsequently doped by boron implantation. Or, boron doped polysilicon may be deposited on the gate dielectric. The techniques for depositing doped or undoped polysilicon and doping polysilicon with boron by implantation are well known in the art and are not elaborated upon here. Moreover, in instances when boron is implanted into deposited polysilicon in accordance with the present invention, the boron doping may precede or follow calcium implantation (with or without other intervening process operations).

FIG. 3 illustrates another embodiment of the present invention. A partially-formed semiconductor device 300 is shown in which a layer of calcium doped polysilicon 330 is applied over a gate dielectric 320 and a semiconductor substrate 310. The deposition may be by any suitable technique, such as CVD. As shown in FIG. 3, the doped layer of polysilicon 330 is deposited to the full desired thickness for the gate electrode, for example, about 1000 to 1500 Å for a 0.1 micron device size regime. It should be noted a variation on this embodiment is to deposit a thin calcium doped polysilicon film followed by capping it with another polysilicon film without calcium doping to achieve the desired thickness.

In this embodiment, since calcium is present in the deposited poly, no calcium implant is required. In general, the deposited poly is also doped with boron so that the resulting poly layer is both calcium and boron doped. However, it is also possible to deposit calcium doped poly and then subsequently introduce the boron dopant by implantation.

While not wishing to be bound by theory, it is believed that physical/chemical attraction between calcium and boron inhibits movement of boron out of the polysilicon gate electrode material, thereby reducing boron penetration and improving device performance. Moreover, it is believed that the attraction between calcium and boron may help integrate boron into the polysilicon crystal structure from the interstitial spaces or grain boundaries making more dopant available to enhance the conductivity of the polysilicon gate electrode material. The improved dopant activation represents a separate benefit from the incorporation of calcium in the gate electrode material by reducing the poly depletion effect.

FIG. 4 is a schematic representation of a P-channel MOSFET 400 according to one embodiment of the present invention. A gate electrode 430 composed of a polysilicon layer formed on top of a gate dielectric 420, is bounded by spacers 470, which may be formed from, for example, silicon oxynitride or some other suitable dielectric/barrier material, and sidewalls 440, which may, for example, be formed from, for example, silicon dioxide or some other suitable dielectric material. Electrode 430, sidewalls 440, and spacers 470 are formed over a semiconductor substrate 310, which has been doped to form a source region 450 and a drain region 460. Further, the polysilicon gate electrode 430 contains calcium, which has been incorporated by doping (by implantation), deposition, or other similar means. The poly gate electrode 430 is also doped with boron. In preferred embodiments, the calcium/boron ratio ranges from about 1:4 to about 1:1, for example, about 1:1.

FIG. 5 illustrates a general process flow of stages in a method of providing a calcium doped poly gate electrode layer in a partially formed semiconductor device. The partially formed device may subsequently made into a p-channel MOS field effect transistor (PMOS) by further processing. The method involves providing a semiconductor substrate (505), forming a gate dielectric layer on the substrate (510), and forming a calcium and boron doped polysilicon gate electrode layer on the gate dielectric (515). As described above, and further below with reference to additional process flows, the calcium and boron doped gate electrode layer may be formed by a variety of techniques in accordance with the present invention.

FIG. 6 illustrates stage in a process for making a semiconductor device with at least one P-channel MOSFET as shown in FIG. 4 in accordance with one specific embodiment of the present invention. A semiconductor substrate is provided in a step 605, and a gate dielectric layer is applied in a step 610. This is followed by the deposition of a layer of polysilicon having a thickness of about the final thickness desired for the gate electrode on the gate dielectric layer in a step 615. In a preferred embodiment of the present invention, for a device size regime of 0.1 micron, the polysilicon layer is approximately 1000–1500 Å thick. In a step 620, calcium is implanted with a dose of about $0.5e15/cm^2$ to $2e15/cm^2$. Note further, that the polysilicon layer may contain (be doped with) a concentration of boron when it is applied, or boron dopant may be added by implantation after poly deposition. In a step 635, a gate electrode is formed by well-known process steps, i.e. by patterning and etching the polysilicon and gate dielectric layers. In a step 640, the substrate region is doped to form source and drain regions, using methods well known by those skilled in the art.

Another implementation of the present invention is illustrated in FIG. 7. A semiconductor substrate is provided in a step 710, and a gate dielectric layer is formed in a step 715. A first thin layer of polysilicon (e.g., about 100–200 Å thick for a 0.1 micron device size regime) is deposited over the substrate in step 720. This layer of polysilicon may contain boron upon application or may be doped with boron after application. Next, in a step 725, a lower-energy and lower dose calcium implantation than that described in connection with FIG. 6 is performed—for example, implantation energy in the range of 1–5 keV at a dose of $0.2e15/cm^2$ to $1e15/cm^2$. Note that the aforementioned boron can be added to the polysilicon before or after step 725. In step 730, a second layer of polysilicon (e.g., about 800–1400 Å thick) is applied. As in step 720, this layer may or may not contain boron, and the boron may be added after application of the layer. FIG. 7 ends with steps 735 and 740, which are identical to steps 635 and 640 as described with respect to FIG. 6.

A further alternative implementation of the present invention is illustrated in FIG. 8. As in the methods described in FIGS. 6 and 7, this variation begins with providing a semiconductor substrate in a step 810 and the application of a gate dielectric layer in a step 815. Next, in a step 820, a layer of calcium-doped polysilicon is applied, generally by deposition, for example, by chemical vapor deposition (CVD) over the gate dielectric layer. The conditions required for this calcium doped poly deposition are readily ascertainable by those skilled in the art given the parameters described herein. Additionally, as in FIGS. 6 and 7, the polysilicon layer may also contain boron, either by deposition or by subsequent implantation doping. FIG. 8 ends with steps 835 and 840, which are identical to steps 635 and 640 as described with respect to FIG. 6.

Although illustrative embodiments and applications of this invention are shown and described herein, many variations and modifications are possible which remain within the concept, scope, and spirit of the invention, and these variations would become clear to those of ordinary skill in the art. For example, alternately, in some embodiments of the invention, a separate layer of calcium may be applied in a thin atomic layer (e.g., from about 1 to 3 atoms thick) between the layer of polysilicon and the gate electrode by atomic layer deposition (ALD) or some other method. Accordingly, the present embodiments are to be considered as illustrative and not restrictive, and the invention is not to be limited to the details given herein, but may be modified within the scope and equivalents of the appended claims.

What is claimed is:

1. A semiconductor device, comprising:
 a P-channel MOS field-effect transistor comprising,
 a semiconductor substrate;
 a gate dielectric on the substrate; and
 a calcium and boron doped polysilicon gate electrode on the gate dielectric.

2. The semiconductor device of claim 1 wherein the calcium and boron dopants are present in the polysilicon in a ratio of about 1:4 to 1:1.

3. The semiconductor device of claim 1, wherein the calcium and boron dopants are present in the polysilicon in a ratio of about 1:1.

4. The semiconductor device of claim 1, wherein the calcium is substantially uniformly distributed throughout the polysilicon gate electrode.

5. The semiconductor device of claim 1, wherein the calcium is substantially concentrated at or near the polysilicon gate electrode/gate dielectric interface.

6. The semiconductor device of claim 5, wherein the calcium is at least partially integrated in the polysilicon crystal structure.

7. The semiconductor device of claim 6, wherein the calcium dopant dose is about $0.5e15/cm^2$ to $2e15/cm^2$.

8. The semiconductor device of claim 1, wherein the device is a CMOS device.

9. The semiconductor device of claim 1, wherein the device is a PMOS device.

10. A method of making a semiconductor device having a P-channel MOS field-effect transistor, the method comprising:
 providing a semiconductor substrate;
 forming a gate dielectric layer on the substrate; and
 forming a calcium and boron doped polysilicon gate electrode layer on the gate dielectric.

11. The method of claim 10, further comprising:
 patterning and etching the polysilicon and dielectric layers layer to form a gate electrode;
 implanting the substrate with dopant to form source and drain regions.

12. The method of claim 10, wherein the polysilicon gate electrode layer formation comprises:
 depositing a layer of boron doped polysilicon on the gate dielectric layer;
 implanting the deposited polysilicon with calcium such that the calcium is substantially concentrated at the polysilicon/dielectric interface.

13. The method of claim 12, wherein the polysilicon layer is deposited to its full thickness prior to calcium implantation.

14. The method of claim 12, wherein the polysilicon layer is about 1000 to 1500 Å thick.

15. The method of claim 12, wherein the calcium implantation is conducted at a dose of about $0.5e15/cm^2$ to $2e15/cm^2$.

16. The method of claim 12, wherein the polysilicon gate electrode layer formation comprises:
   forming a first thin layer of polysilicon on the gate dielectric layer;
   implanting the calcium into the first layer of polysilicon; and
   forming a second layer of polysilicon over the calcium doped first layer.

17. The method of claim 16, wherein the first layer of polysilicon is about 100–200 Å thick.

18. The method of claim 17, wherein the second layer of polysilicon is 800–1400 Å thick.

19. The method of claim 17, wherein the calcium implantation is conduct at a dose of about $0.2e15/cm^2$ to $1e15/cm^2$ and an energy of about 1–5 keV.

20. The method of claim 10, wherein the polysilicon gate electrode layer formation comprises:
   depositing a layer of undoped polysilicon on the gate dielectric layer;
   implanting the deposited polysilicon with boron and calcium.

21. The method of claim 20, wherein boron implantation precedes calcium implantation.

22. The method of claim 20, wherein calcium implantation precedes boron implantation.

23. The method of claim 10, wherein the polysilicon gate electrode layer formation comprises:
   depositing a layer of calcium doped polysilicon on the gate dielectric layer;
   implanting the deposited polysilicon with boron.

24. The method of claim 10, wherein the polysilicon gate electrode layer formation comprises:
   depositing a first thin layer of calcium doped polysilicon on the gate dielectric layer;
   depositing a second thicker layer of polysilicon on the first layer;
   implanting the deposited polysilicon layers with boron.

25. The method of claim 10, wherein the polysilicon gate electrode layer formation comprises:
   depositing a layer of boron and calcium doped polysilicon on the gate dielectric layer.

* * * * *